United States Patent [19]

Johnson

[11] Patent Number: 4,764,733

[45] Date of Patent: Aug. 16, 1988

[54] ASYMMETRICAL DUAL INPUT AMPLIFIER

[75] Inventor: William A. Johnson, Minneapolis, Minn.

[73] Assignee: Cross Technology, Inc., Eden Prairie, Minn.

[21] Appl. No.: 36,584

[22] Filed: Apr. 10, 1987

[51] Int. Cl.⁴ ............................................. H03F 3/68
[52] U.S. Cl. ...................................... 330/84; 330/147; 330/295; 330/301
[58] Field of Search ............... 330/69, 84, 124 R, 147, 330/151, 275, 295, 301

[56] References Cited

U.S. PATENT DOCUMENTS

| | | | |
|---|---|---|---|
| 3,260,955 | 10/1987 | Offner | 330/69 |
| 3,684,973 | 8/1972 | Duck | 330/30 R |
| 4,013,973 | 3/1977 | van de Plassche | 330/30 R |
| 4,034,306 | 7/1977 | Barber et al. | 330/30 D |
| 4,085,382 | 4/1978 | Barber et al. | 330/262 |
| 4,295,063 | 10/1981 | Price, Jr. | 307/362 |

OTHER PUBLICATIONS

"Offset VBE Biased Amplifier," *Semicustom Circuit Design*, Cherry Semiconductor Corp., pp. 4–18.
"LM381 Low Noise Dual Preamplifier," *National Audio Handbook*, pp. 2-12 to 2-14.
*Analysis and Design of Analog Integrated Circuits*, 2nd ed., P. R. Gray, R. G. Meyer, pp. 504 and 514.
"Low Noise Preamplifier," *Monochip Application Note APN-25*, Interdesign, p. 9 (p. 1 included for identification).
*Designing Electronic Circuits*, 1986, p. 65.
*The Encyclopedia of Electronic Circuits*, 1985, p. 85.
*Illustrated Encyclopedia of Solid State Circuits and Applications*, 1984, p. 47.
*Bipolar and MOS Analog Integrated Circuit Design*, A. B. Grebene, pp. 245–246, 382–383, 417, 424–425.

Primary Examiner—James B. Mullins
Attorney, Agent, or Firm—Kinney & Lange

[57] ABSTRACT

An amplifier system having an input active device at its first input and having its second input provided through an inverting means to that first input.

19 Claims, 1 Drawing Sheet

ASYMMETRICAL DUAL INPUT AMPLIFIER

BACKGROUND OF THE INVENTION

1. Field of the Invention

The present invention relates to integrated circuit amplifiers, and more particularly, to such amplifiers having two signal inputs.

Reducing size while providing full performance capability is a major goal for a successful hearing aid. Achieving such a goal usually requires that the number of components in the hearing aid system be minimized. Of course, keeping the number of components in a hearing aid system small in number often conflicts with the desire to provide full capability.

Among the capabilities desired for hearing aids is the ability to use a "telephone coil", i.e. inductive sensors, therewith so that the hearing aid user can switch such a coil into the circuit to serve as the incoming information sensor for use with a telephone. On the other hand, such a coil is to be switched out of the circuit and a microphone switched into the circuit to sense the information in acoustic signals which are exchanged in ordinary face-to-face conversation. Another desirable capability is providing a tone control to enable adjusting the frequency content of that which is heard by the user of the hearing aid.

Such capabilities require provision of a coil to permit inductive sensing of telephone signals and a microphone to permit acoustic sensing. Tone control will require providing a potentiometer to permit varying circuit conditions to thereby control tone. In addition, coupling capacitors, to couple the coil and the microphone to the circuit, and a switch are needed. Further circuitry to accommodate these capabilities is often required.

These components are usually introduced into the hearing aid circuitry to interact therewith at the inputs to the amplification system. Thus, an amplification system formed in a monolithic integrated circuit having its initial portion containing as many of the circuit components as possible to accommodate such capabilities is needed to minimize the component count.

SUMMARY OF THE INVENTION

The present invention provides an amplifier having an output and a pair of inputs having a primary amplification means with an input active device having its control region connected to one amplifier input, and having an inverting means with an active device having its control region connected to the other amplifier input. An output of the inverting means active device is electrically connected to the control region of the primary amplification means active device. A current source provides the loads for these two active devices, and each has impedances arrayed thereabout, including an impedance between the inverting active device control region and both its output and the corresponding amplifier input. In addition, there is a feedback impedance within the primary amplification means. Transient control limiting devices are connected in the primary amplification means as well as a supplementary current sinking means.

DETAILED DESCRIPTION OF THE PREFERRED EMBODIMENTS

Figure 1:
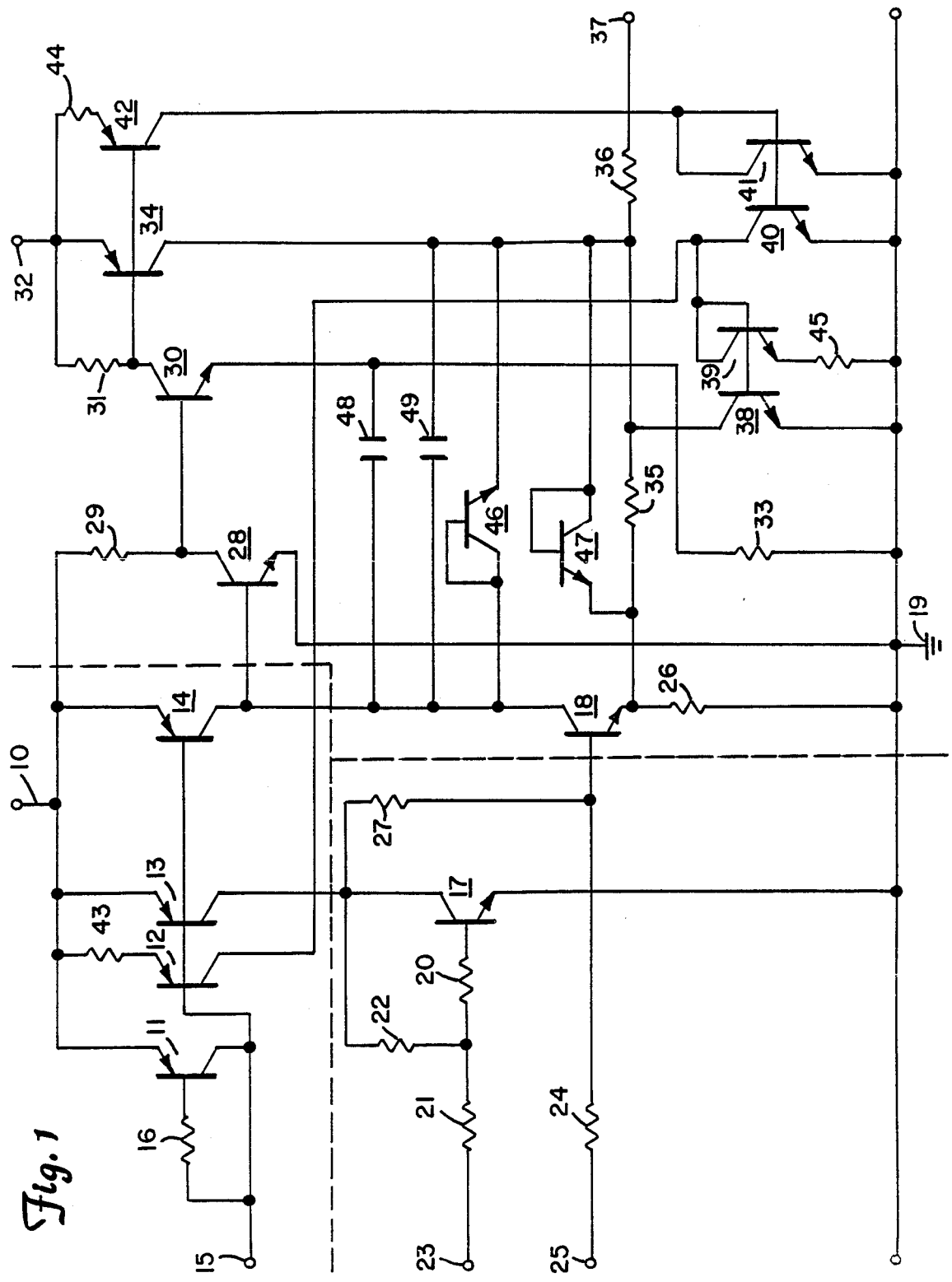
FIG. 1 is a schematic diagram of the present invention.

FIG. 1 shows a schematic diagram of the amplifier system divided into sections by dashed lines. In the upper left hand corner, set off by such dashed lines, there is provided a current source arrangement for providing precise currents. This current source arrangement is supplied a well regulated voltage from a first terminal means, 10, adapted for connection to a source of positive voltage. Connected to terminal means 10 are the emitters of four matched pnp bipolar transistors, 11, 12, 13 and 14. Transistor 11 has its collector electrically connected to terminal means, 15, adapted for connecting to a current sink drawing a precise current. Transistor 11 has its base connected through a resistor, 16, also to terminal means 15. Thus, transistor 11 is effectively connected as a diode with slightly more than its base emitter voltage occurring between terminal 10 and current sink terminal 15.

With transistor 11 well matched in construction to transistors 12, 13 and 14, approximately the same current will be drawn out of the base of each of transistors 13 and 14 as is drawn from the base of transistor 11. Similarly, approximately the same collector current will flow out of each collector of transistors 13 and 14 as flows out of the collector of transistor 11. Resistor 16 is provided in the base of transistor 11 to reduce the effects of any low current gains occurring in each of transistors 11, 12, 13 and 14 because of fabrication variances or temperature of operation. In such a situation, an increased base current will flow in the base of transistor 11 increasing the voltage drop across resistor 16. This increased voltage drop on resistor 16 will increase the base-to-emitter voltages of transistors 12 through 14 through increasing the base current of each to thereby compensate for the lower current gains.

The well matched collector currents from transistors 13 and 14 are each drawn primarily as a collector load current for each of two corresponding further transistors, 17 and 18, respectively, each of which is an npn bipolar transistor. Transistor 18 is part of a primary amplification portion to the right of the dashed lines in FIG. 1. Transistor 17, on the other hand, is a portion of an inverting arrangement shown to the left and below the dashed lines in FIG. 1.

The emitter of transistor 17 is electrically connected to a ground reference voltage terminal, 19. The base of transistor 17 is electrically connected through a resistor, 20, to the junction of two further resistors, 21 and 22. Resistor 21 has its side opposite this junction electrically connected to the amplifier inverting input terminal, 23. The side of resistor 22 opposite this junction is electrically connected in a feedback configuration to the collector of transistor 17.

The base of transistor 18 is electrically connected to one side of a further resistor, 24, the other side of which in turn is electrically connected to the non-inverting input of the amplifier, 25. The emitter of transistor 18 is electrically connected to one side of a resistor, 26. The other side of resistor 26 is connected to ground reference terminal 19.

Current from the collector of transistor 13, in addition to providing load current to the collector of transistor 17, provides bias current to the base of each of transistors 17 and 18 to set the operating point collector current therethrough. The base current for transistor 17 is carried through resistor 22 while the base current for transistor 18 is provided through another resistor, 27, of substantially the same resistance value as resistor 22. One side of resistor 27 is electrically connected to the collector of transistor 17 and the other side thereof to the base of transistor 18.

Since transistors 17 and 18 each are to operate with approximately the same collector currents from the collectors of matched transistors 13 and 14, and since transistors 17 and 18 are very closely matched to one another in construction (except in emitter area as will be described below), they should each draw approximately the same base current to thereby draw the same collector current. Also, approximately the same voltage operating point should be present at each of amplifier inputs 23 and 25 to present nearly identical input conditions. The presence of resistor 26 in the emitter of transistor 18, however, requires that the base emitter voltage of transistor 18 must be somewhat less than that of transistor 17 with its emitter to ground, even though both must carry approximately the same collector and base currents. This can be accommodated by choosing the emitter area of transistor 18 to be somewhat larger than that of transistor 17. This permits transistor 18 to still sink approximately the same collector current as transistor 17 through having substantially the same base current as transistor 17 despite having a smaller base-emitter voltage.

In operation, signals provided on non-inverting input terminal 25 to drive transistor 18 lead to changes at the collector of transistor 18 which affect the base of a further npn bipolar transistor, 28, which draws collector current through a collector resistor, 29, electrically connected to terminal means 10. The emitter of transistor 28 is electrically connected to ground reference terminal 19. Voltage changes across resistor 29 drive the base of a further npn bipolar transistor, 30, which draws collector current through a further resistor, 31. Transistor 28 and load resistor 29 are connected to regulated voltage so that the higher gain portions of the primary amplifier portion are less subject to noise occurring on the voltage supply to which they are connected.

Transistor 30 is connected through load resistor 31 to a terminal means, 32, adapted for connection to an unregulated voltage supply which, in the case of a hearing aid, would be the positive output of a battery. Transistor 30 also has some emitter degeneration provided by a further resistor, 33, electrically connected between this emitter and ground reference terminal means 19. Voltage changes across resistor 31 drives the base of a further transistor, 34, having its emitter connected to terminal means 32. The collector of transistor 34 is connected through a resistor, 35, in a feedback configuration to the junction of resistor 26 and the emitter of transistor 18.

The collector of transistor 34 forms the output of the primary amplification means. The ratio of the resistor value of resistor 35 to the resistance value of resistor 26 determines the gain of the primary amplification portion of the amplifier shown. A further resistor, 36, is connected between the output of the primary amplification means and the amplifier output terminal, 37, as a basis for providing a low-pass filter at the amplifier output through use of an external capacitor connected between terminal 37 and ground reference terminal 19. If such a low-pass filter is not needed resistor 36 can be omitted.

If such an external capacitor is used, there is likely to be some difficulty in the primary amplification means output being able to follow input signals of sufficiently high frequency content because the only discharge path for such a capacitor is through resistors 35 and 36 in the absence of other measures. However, corrective measures for this difficulty have been provided in the schematic of FIG. 1 by the four npn bipolar transistors, 38, 39, 40 and 41, by transistor 12 and by a further pnp bipolar transistor, 42, and the emitter resistors, 43 and 44, electrically connected between the emitter of pnp bipolar transistor 12 and terminal 10, and between the emitter of transistor 42 and terminal 32, respectively.

Transistor 12 provides a precise current at its collector just as do transistors 13 and 14, but it is of a much smaller value, only one tenth as much, in transistor 12 because of the presence of resistor 43. This current is supplied to the base of transistor 38, to both the collector and base of transistor 39, and to the collector of transistor 40. Because of transistor 39 having an emitter resistor, 45, between its emitter and terminal 19, the base of transistor 38 would draw much of the current supplied by the collector of transistor 12 which would be sufficient to cause transistor 38 to be fully in the "on" condition.

However, the collector of transistor 30 drives not only the base of the output transistor 34 but also the base of transistor 42. If the collector of transistor 30 is at a relatively low voltage or is generally near its operating point, transistor 42 will be in the "on" condition. In such condition, transistor 42 will provide sufficient current through its collector to the junction of the base and collector of transistor 41, connected as a diode, and to the base of transistor 40 to cause transistor 40 through its collector to shunt the current provided at the collector of transistor 12 to ground reference terminal 19. As a result, transistor 38 will be in the "off" condition. Only when signals at the collector of transistor 30 are of sufficiently high voltage to sufficiently place transistor 42 in an "off" condition will transistor 40 also go into the "off" condition permitting transistor 38 to sink current from the output of the primary amplification means at the collector of transistor 34. Thus, transistor 38 sinks current from the output of the amplifier at terminal 37 only if transistor 34 is nearly off as it will be by the voltage on an output capacitor, if used, tending to keep transistor 18 "off" by keeping the emitter voltage thereof relatively high with respect to its base voltage. This occurs through the output capacitor voltage being applied to the emitter of transistor 18 through the voltage action of resistors 35, 36 and 26.

A further feature of the primary amplification means is the presence of two further transistors, 46 and 47, each connected as a diode. Transistor 46 has its base and collector connected to the collector of transistor 18 as the anode of the diode it forms, and the emitter of transistor 46 is the cathode which is connected to the collector of transistor 34. The collector and base of transistor 47, as the anode of the diode formed thereby, are connected to the collector of transistor 34, and the emitter of transistor 47 as a cathode is connected to the emitter of transistor 18. These two diode means gradually limit the magnitudes of sharp transient signals being passed through the amplifier to prevent a user of the hearing aid from experiencing the corresponding jarring effects they cause. Transistor 47 limits the voltage drop that can occur across resistor 35 from the collector of transistor 34 to the emitter of transistor 18. Transistor 46, on the other hand, prevents the base of transistor 28 from dropping too far below the collector of transistor 34.

The inverting arrangement of the amplifier with transistor 17, shown left and below the dashed lines in FIG. 1, provides another amplification and a polarity change for signals that are provided at amplifier input terminal 23 rather than at terminal 25. The gain due to the inverting means is primarily set by the ratio of the resistance value of resistor 22l to the resistance value of resistor 21. Thus, the inverting arrangement provides an additional amplification factor useful if the "telephone coil" inductive sensor is capacitively connected to amplifier input terminal 23. For ordinary conversation, a switch would be opened between the coil and terminal 23 and another switch closed between terminal 25 and the microphone with its coupling capacitor together used for ordinary face-to-face conversation. A potentiometer connected differentially between terminals 23 and 25, such that the resistance between them can be varied, leads to a variable input impedance as viewed from terminal 25. This variable input impedance, in conjunction with the coupling capacitor, can provide tone control for the amplifying system. Alternatively, the telephone coil for inductive pickup can be connected differentially between terminals 23 and 25 to eliminate the need for a coupling capacitor altogether.

A capacitor, 48, provides some frequency rolloff over the gain stages associated with transistors 28 and 30 to prevent overshoot occurring in these stages. A further capacitor, 49, provides frequency cutoff for the primary amplification means past the normal frequency range of hearing to provide stability for the amplifier. These capacitors are formed as parallel plate capacitors in the monolithic integrated circuit chip.

The npn bipolar transistors all have the same constructional design and reasonably match one another with the exception of emitter area differencing, as already indicated. Similarly, the pnp bipolar transistors are all constructionally the same in the monolithic integrated circuit and therefore reasonably match one another. The resistors are formed by ion implantation in the monolithic integrated circuit chip.

For typical bipolar integrated circuit fabrication processes, the capacitors 48 and 49 might each be chosen to have capacitance value of 33 pF, and the resistors might be chosen to have the following resistance values in ohms:

| Resistor | Resistance Value |
|---|---|
| 16 | 16,000 |
| 20 | 6,500 |
| 21 | 2,000 |
| 22 | 32,000 |
| 24 | 2,000 |
| 26 | 180 |
| 27 | 32,000 |
| 29 | 100,000 |
| 31 | 100,000 |
| 33 | 8,000 |
| 35 | 18,800 |
| 36 | 2,000 |
| 43 | 8,000 |
| 44 | 16,000 |
| 45 | 32,000 |

Although the present invention has been described with reference to preferred embodiments, workers skilled in the art will recognize that changes may be made in form and detail without departing from the spirit and scope of the invention.

What is claimed is:

1. An amplifier having an output and first and second inputs, said amplifier comprising:

a primary amplification means having an output electrically connected to said amplifier output and having an input electrically connected to said amplifier first input, said primary amplification means being capable of providing signals at said primary amplification means output which are substantially similar to signals provided at said primary amplification means input but of a larger magnitude, said primary amplification means comprising an input device having first and second terminating regions and having a control region therein by which said primary amplification means input device is capable of being directed, through electrical energization thereof, to effectively provide a conductive path of a selected conductivity between said primary amplification means input device first and second terminating regions, said primary amplification means input device control region being electrically connected to said primary amplification means input; and an inverting means comprising:

an inverting device having first and second terminating regions and having a control region therein by which said inverting device is capable of being directed, through electrical energization thereof, to effectively provide a conductive path of a selected conductivity between said inverting device first and second terminating regions; and first, second and third inverting impedance means each having first and second terminating regions between which each exhibits electrical impedance, said first inverting impedance means first terminating region being electrically connected to said amplifier second input, said first inverting impedance means second terminating region and said second inverting impedance means second terminating region being electrically connected together and electrically connected to said inverting device control region, said second inverting impedance means first terminating region and said third inverting impedance means first terminating region being electrically connected together and electrically connected to said inverting device first terminating region, and said third inverting impedance means second terminating region being electrically connected to said primary amplification means input device control region, said second inverting impedance means having an impedance value substantially greater than that of said first inverting impedance means to thereby provide a substantial gain through said inverting means.

2. The apparatus of claim 1 wherein said inverting device first terminating region is electrically connected to a first current supply means and said primary amplification means input device first terminating region is electrically connected to said first current supply means, said first current supply means being capable of supplying substantially identical currents to said inverting device first terminating region and said primary amplification means input device first terminating region.

3. The apparatus of claim 2 wherein said inverting device second terminating region is electrically connected to a reference terminal means adapted for connection to a first voltage supply and said primary amplification means input device second terminating region is electrically connected to a first primary amplification means impedance device having first and second terminating regions between which it exhibits electrical impedance, said first primary amplification means impedance device first terminating region being electrically connected to said primary amplification means input device second terminating region, and said first primary amplification means impedance means second terminating region being electrically connected to said first reference terminal means.

4. The apparatus of claim 3 wherein said inverting device and said primary amplification means input device are each bipolar transistors of substantially identical construction except for said primary amplification input device having an emitter area larger than that of said inverting device, said inverting device and said primary amplification means control regions each being a base, said inverting device and said primary amplification means first primary regions each being a collector, and said inverting device and said primary amplification means second terminating region each being an emitter.

5. The apparatus of claim 4 wherein said second inverting impedance means and said third inverting impedance means have substantially identical impedance values.

6. The apparatus of claim 2 wherein said inverting device and said primary amplification means input device are each bipolar transistors of substantially identical construction except for said primary amplification input device having an emitter area larger than that of said inverting device, said inverting device and said primary amplification means control regions each being a base, said inverting device and said primary amplification means first primary regions each being a collector, and said inverting device and said primary amplification means second terminating region each being an emitter.

7. The apparatus of claim 6 wherein said second inverting impedance means and said third inverting impedance means have substantially identical impedance values.

8. The apparatus of claim 1 wherein said inverting device second terminating region is electrically connected to a reference terminal means adapted for connection to a first voltage supply and said primary amplification means input device second terminating region is electrically connected to a first primary amplification means impedance device having first and second terminating regions between which it exhibits electrical impedance, said first primary amplification means impedance device first terminating region being electrically connected to said primary amplification means input device second terminating region, and said first primary amplification means impedance means second terminating region being electrically connected to said reference terminal means.

9. The apparatus of claim 8 wherein said primary amplification means further comprises a second primary amplification means impedance means having first and second terminating regions between which it exhibits electrical impedance, said second primary amplification means impedance means first terminating region being electrically connected to said primary amplification means output, and said second primary amplification means impedance means second terminating region being electrically connected to said primary amplification means input device second terminating region.

10. The apparatus of claim 1 wherein said inverting device and said primary amplification means input device are each bipolar transistors of substantially identical construction except for said primary amplification input device having an emitter area larger than that of said inverting device, said inverting device and said primary amplification means control regions each being a base, said inverting device and said primary amplification means first primary regions each being a collector, and said inverting device and said primary amplification means second terminating region each being an emitter.

11. The apparatus of claim 1 wherein said primary amplification means further comprises output amplification means having an input and an output with said output amplification means being capable of providing signals on said output amplification means output which are substantially similar to signals occurring on said output amplification means input but of a larger magnitude, said output amplification means input being electrically connected to said primary amplification means input device first terminating region and said output amplification means output being electrically connected to said primary amplification means output.

12. The apparatus of claim 11 wherein said inverting device second terminating region is electrically connected to a reference terminal means adapted for connection to a first voltage supply and said primary amplification means input device second terminating region is electrically connected to a first primary amplification means impedance device having first and second terminating regions between which it exhibits electrical impedance, said first primary amplification means impedance device first terminating region being electrically connected to said primary amplification means input device second terminating region, and said first primary amplification means impedance means second terminating region being electrically connected to said reference terminal means.

13. The apparatus of claim 12 wherein said primary amplification means further comprises a second primary amplification means impedance means having first and second terminating regions between which it exhibits electrical impedance, said second primary amplification means impedance means first terminating region being electrically connected to said primary amplification means output, and said second primary amplification means impedance means second terminating region being electrically connected to said primary amplification means input device second terminating region.

14. The apparatus of claim 1 wherein there is provided a fourth inverting impedance means having first and second terminating regions between which it exhibits electrical impedance, said fourth inverting impedance means first terminating region being electrically connected to said primary amplification means input device control region, and said fourth inverting impedance means second terminating region being electrically connected to said primary amplification means input, said fourth inverting impedance means having an impedance value approximately that of said first inverting impedance means.

15. An amplifier having an output and first and second inputs, said amplifier comprising:
a primary amplification means having an output electrically connected to said amplifier output and having an input electrically connected to said amplifier first input, said primary amplification means being capable of providing signals at said primary amplification means output which are substantially similar to signals provided at said primary amplification means input but of a larger magnitude, said primary amplification means comprising an input device having first and second terminating regions and having a control region therein by which said primary amplification means input device is capable of being directed, through electrical energization thereof, to effectively provide a conductive path of a selected conductivity between said primary amplification means input device first and second terminating regions, said primary amplification means input device control region being electrically connected to said primary amplification means input and said primary amplification means input device second terminating region being electrically connected to both a first and a second primary amplification means impedance devices each having first and second terminating regions between which it exhibits electrical impedance with said first primary amplification means impedance device first terminating region and with said second primary amplification means impedance means second terminating region both being electrically connected to said primary amplification means input device second terminating region, said first primary amplification means impedance device second terminating region being electrically connected to a reference terminal means adapted for connection to a first voltage supply, and said second primary amplification means impedance means first terminating region being electrically connected to said primary amplification means output, with there being first and second diode means in said primary amplification means each having an anode region and a cathode region, said first diode means being electrically connected between said primary amplification means output and said primary amplification means input device first terminating region, and said second diode means being electrically connected between said primary amplification means output and said primary amplification means input device second terminating region; and an inverting means comprising:
  an inverting device having first and second terminating regions and having a control region therein by which said inverting device is capable of being directed, through electrical energization thereof, to effectively provide a conductive path of a selected conductivity between said inverting device first and second terminating regions, said inverting device second terminating region being electrically connected to said reference terminal means; and
  first, second and third inverting impedance means each having first and second terminating regions between which each exhibits electrical impedance, said first inverting impedance means first terminating region being electrically connected to said amplifier second input, said first inverting impedance means second terminating region and said second inverting impedance means second terminating region being electrically connected together and electrically connected to said inverting device control region, said second inverting impedance means first terminating region and said third inverting impedance means first terminating region being electrically connected together and electrically connected to said inverting device first terminating region, and said third inverting impedance means second terminating region being electrically connected to said primary amplification means input device control region.

16. An amplifier having an output and first and second inputs, said amplifier comprising:
  a primary amplification means having an output electrically connected to said amplifier output and having an input electrically connected to said amplifier first input, said primary amplification means being capable of providing signals at said primary amplification means output which are substantially similar to signals provided at said primary amplification means input but of a larger magnitude, said primary amplification means comprising an input device having first and second terminating regions and having a control region therein by which said primary amplification means input device is capable of being directed, through electrical energization thereof, to effectively provide a conductive path of a selected conductivity between said primary amplification means input device first and second terminating regions, said primary amplification means input device control region being electrically connected to said primary amplification means input and said primary amplification means input device second terminating region being electrically connected to both a first and a second primary amplification means impedance devices each having first and second terminating regions between which it exhibits electrical impedance with said first primary amplification means impedance device first terminating region and with said second primary amplification means impedance means second terminating region both being electrically connected to said primary amplification means input device second terminating region, said first primary amplification means impedance device second terminating region being electrically connected to a reference terminal means adapted for connection to a first voltage supply, and said second primary amplification means impedance means first terminating region being electrically connected to said primary amplification means output, with there being a current sinking means in said primary amplification means having first and second terminating regions and having a control region therein by which said primary amplification means current sinking means is capable of being directed, through electrical energization thereof, to effectively provide a conductive path of a selected conductivity between said primary amplification means current sinking means first and second terminating regions, said primary amplification means current sinking means first terminating region being electrically connected to said primary amplification means output and said primary amplification means current sinking means second terminating region being electrically connected to said reference terminal means, said primary amplification means current sinking means control region being electrically connected to a first current sinking controller which electrically energizes said primary amplification means current sinking means control region on those occasions that said primary amplification means output has a voltage value sufficiently close to that of said reference terminal means; and an inverting means comprising:

an inverting device having first and second terminating regions and having a control region therein by which said inverting device is capable of being directed, through electrical energization thereof, to effectively provide a conductive path of a selected conductivity between said inverting device first and second terminating regions, said inverting device second terminating region being electrically connected to said reference terminal means; and first, second and third inverting impedance means each having first and second terminating regions between which each exhibits electrical impedance, said first inverting impedance means first terminating region being electrically connected to said amplifier second input, said first inverting impedance means second terminating region and said second inverting impedance means second terminating region being electrically connected together and electrically connected to said inverting device control region, said second inverting impedance means first terminating region and said third inverting impedance means first terminating region being electrically connected together and electrically connected to said inverting device first terminating region, and said third inverting impedance means second terminating region being electrically connected to said primary amplification means input device control region.

17. An amplifier having an output and first and second inputs, said amplifier comprising:

a primary amplification means having an output electrically connected to said amplifier output and having an input electrically connected to said amplifier first input, said primary amplification means being capable of providing signals at said primary amplification means output which are substantially similar to signals provided at said primary amplification means input but of a larger magnitude, said primary amplification means comprising an input device having first and second terminating regions and having a control region therein by which said primary amplification means input device is capable of being directed, through electrical energization thereof, to effectively provide a conductive path of a selected conductivity between said primary amplification means input device first and second terminating regions, said primary amplification means input device control region being electricall connected to said primary amplification means input and said primary amplification means input device second terminating region being electrically connected to both a first and a second primary amplification means impedance devices each having first and second terminating regions between which it exhibits electrical impedance with said first primary amplification means impedance device first terminating region and with said second primary amplification means impedance means second terminating region both being electrically connected to said primary amplification means input device second terminating region, said first primary amplification means impedance device second terminating region being electrically connected to a reference terminal means adapted for connection to a first voltage supply, and said second primary amplification means impedance means first terminating region being electrically connected to said primary amplification means output, with there being first and second diode means in said primary amplification means each having an anode region and a cathode region, said first diode means being electrically connected between said primary amplification means output and said primary amplification means input device first terminating region, and said second diode means being electrically connected between said primary amplification means output and said primary amplification means input device second terminating region, and with there being an output amplification means in said primary amplification means having an input and an output with said output amplification means being capable of providing signals on said output amplification means output which are substantially similar to signals occurring on said output amplification means input but of a larger magnitude with said output amplification means input being electrically connected to said primary amplification means input device first terminating region and said output amplification means output being electrically connected to said primary amplification means output; and an inverting means comprising:

an inverting device having first and second terminating regions and having a control region therein by which said inverting device is capable of being directed, through electrical energization thereof, to effectively provide a conductive path of a selected conductivity between said inverting device first and second terminating regions, said inverting device second terminating region being electrically connected to said reference terminal means; and first, second and third inverting impedance means each having first and second terminating regions between which each exhibits electrical impedance, said first inverting impedance means first terminating region being electrically connected to said amplifier second input, said first inverting impedance means second terminating region and said second inverting impedance means second terminating region being electrically connected together and electrically connected to said inverting device control region, said second inverting impedance means first terminating region and said third inverting impedance means first terminating region being electrically connected together and electrically connected to said inverting device first terminating region, and said third inverting impedance means second terminating region being electrically connected to said primary amplification means input device control region.

18. An amplifier having an output and first and second inputs, said amplifier comprising:

a primary amplification means having an output electrically connected to said amplifier output and having an input electrically connected to said amplifier first input, said primary amplification means being capable of providing signals at said primary amplification means output which are substantially similar to signals provided at said primary amplification means input but of a larger magnitude, said primary amplification means comprising an input device having first and second terminating regions and having a control region therein by which said primary amplification means input device is capable of being directed, through electrical energization thereof, to effectively provide a conductive path of a selected conductivity between said primary amplification means input device first and second terminating regions, said primary amplification means input device control region being electrically connected to said primary amplification means input and said primary amplification means input device second terminating region being electrically connected to both a first and a second primary amplification means impedance devices each having first and second terminating regions between which it exhibits electrical impedance with said first primary amplification means impedance device first terminating region and with said second primary amplification means impedance means second terminating region both being electrically connected to said primary amplificaytion means input device second terminating region, said first primary amplification means impedance device second terminating region being electrically connected to a reference terminal means adapted for connection to a first voltage supply, and said second primary amplification means impedance means first terminating region being electrically connected to said primary amplification means output, with there being a current sinking means in said primary amplification means having first and second terminating regions and having a control region therein by which said primary amplification means current sinking means is capable of being directed, through electrical energization thereof, to effectively provide a conductive path of a selected conductivity between said primary amplification means current sinking means first and second terminating regions, said primary amplification means current sinking means first terminating region being electrically connected to said primary amplification means output and said primary amplification means current sinking means second terminating region being electrically connected to said reference terminal means, said primary amplification means current sinking means control region being electrically connected to a first current sinking controller which electrically energizes said primary amplification means current sinking means control region on those occasions that said primary amplification means output has a voltage value sufficiently close to that of said reference terminal means, and with there being output amplification means in said primary amplification means having an input and an output with said output amplification means being capable of providing signals on said output amplification means output which are substantially similar to signals occurring on said output amplification means input but of a larger magnitude with said output amplification means input being electrically connected to said primary amplification means input device first terminating region and said output amplification means output being electrically connected to said primary amplification means output; and an inverting means comprising:
an inverting device having first and second terminating regions and having a control region therein by which said inverting device is capable of being directed, through electrical energization thereof, to effectively provide a conductive path of a selected conductivity between said inverting device first and second terminating regions, said inverting device second terminating region being electrically connected to said reference terminal means; and
first, second and third inverting impedance means each having first and second terminating regions between which each exhibits electrical impedance, said first inverting impedance means first terminating region being electrically connected to said amplifier second input, said first inverting impedance means second terminating region and said second inverting impedance means second terminating region being electrically connected together and electrically connected to said inverting device control region, said second inverting impedance means first terminating region and said third inverting impedance means first terminating region being electrically connected together and electrically connected to said inverting device first terminating region, and said third inverting impedance means second terminating region being electrically connected to said primary amplification means input device control region.

19. The apparatus of claim 1 wherein said second inverting impedance means and said third inverting impedance means have substantially identical impedance values.

* * * * *